(12) United States Patent
Wang et al.

(10) Patent No.: US 9,299,843 B2
(45) Date of Patent: Mar. 29, 2016

(54) SEMICONDUCTOR STRUCTURE AND MANUFACTURING METHOD THEREOF

(71) Applicant: UNITED MICROELECTRONICS CORP., Hsinchu (TW)

(72) Inventors: Jun-Jie Wang, Changhua County (TW); Po-Chao Tsao, New Taipei (TW); Ming-Te Wei, Changhua County (TW); Shih-Fang Tzou, Tainan (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 31 days.

(21) Appl. No.: 14/078,701

(22) Filed: Nov. 13, 2013

(65) Prior Publication Data

US 2015/0129980 A1 May 14, 2015

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 8,174,058 B2 | 5/2012 | Marshall | |
| 8,361,894 B1* | 1/2013 | Hargrove et al. | 438/526 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2012/0032267 A1* | 2/2012 | Cheng et al. | 257/368 |
| 2012/0313169 A1* | 12/2012 | Wahl et al. | 257/347 |
| 2013/0056826 A1* | 3/2013 | Liu et al. | 257/347 |
| 2013/0137234 A1* | 5/2013 | Baars | H01L 21/31111 438/289 |
| 2013/0175618 A1* | 7/2013 | Cheng et al. | 257/347 |
| 2014/0077296 A1* | 3/2014 | Yamashita et al. | 257/347 |

* cited by examiner

*Primary Examiner* — Charles Garber
*Assistant Examiner* — Alia Sabur
(74) *Attorney, Agent, or Firm* — WPAT, PC; Justin King

(57) ABSTRACT

A semiconductor structure comprises a substrate, a plurality of fins, an oxide layer and a gate structure. The fins protrude from the substrate and are separated from each other by the oxide layer. The surface of the oxide layer is uniform and even plane. The gate structure is disposed on the fins. The fin height is distance between the top of the fins and the oxide layer, and at least two of the fins have different fin heights.

9 Claims, 5 Drawing Sheets

US 9,299,843 B2

SEMICONDUCTOR STRUCTURE AND MANUFACTURING METHOD THEREOF

BACKGROUND

1. Technical Field

The disclosure relates in general to a semiconductor structure and manufacturing method thereof, and more particularly to a FINFET structure and manufacturing method thereof.

2. Description of the Related Art

Fin field effect transistor (FINFET) device is becoming increasingly popular for high performance, low dimension integrated circuits. In the present FINFET manufacturing process, threshold voltage ($V_T$) is controlled by changing implant condition and work function. However, control of work function in metal gate is usually very complicated, and it is very difficult to control the fabrication processes as well.

Since various device performance parameters are related to $V_T$, it is desirable to develop a FINFET structure and manufacturing method thereof that simplified ways of modulating $V_T$ value.

SUMMARY

The disclosure is directed to a semiconductor structure and manufacturing method thereof. The semiconductor structure has different fin heights and a uniform and even surface of STI oxide layer, which is capable of forming identical poly profile, thereby improving the electrical properties and reducing the defect rate of the structure.

According to an embodiment of the present disclosure, a semiconductor structure is provided. The semiconductor structure comprises a substrate, a plurality of fins, an oxide layer and a gate structure. The fins protrude from the substrate and are separated from each other by the oxide layer. The surface of the oxide layer is uniform and even plane. The gate structure is disposed on the fins. The fin height is distance between the top of the fins and the oxide layer, and at least two of the fins have different fin heights.

According to another embodiment, a manufacturing method of semiconductor is provided. The method comprises following steps: forming a plurality of fins on a substrate, wherein a hard mask is disposed on top of the fins, and the fins at least include a first fin and a second fin; forming an oxide material covers the substrate, the fins and the hard mask; removing the oxide material above the hard mask; forming a photoresist layer to cover the second fin; removing the hard mask on the first fin and then etching the first fin; removing the photoresist layer and the hard mask on the second fin; and etching the oxide material to form an oxide layer, wherein the surface of the oxide layer is uniform and even plane, and the distance between the oxide layer and top of the first fin is smaller the distance between the oxide layer and top of the second fin.

According to an alternative embodiment, a manufacturing method of semiconductor is provided. The method comprises following steps: comprising: forming a plurality of fins on a substrate; forming a oxide material between the fins; covering a portion of the fins; etching a not cover portion of the fins; and etching the oxide material to form an oxide layer, wherein the surface of the oxide layer is uniform and even plane; wherein the distance between the top of the fins and the oxide layer is fin height, and at least two of the fins have different fin heights.

The disclosure will become apparent from the following detailed description of the preferred but non-limiting embodiments. The following description is made with reference to the accompanying drawings.

DETAILED DESCRIPTION

Figure 1A:
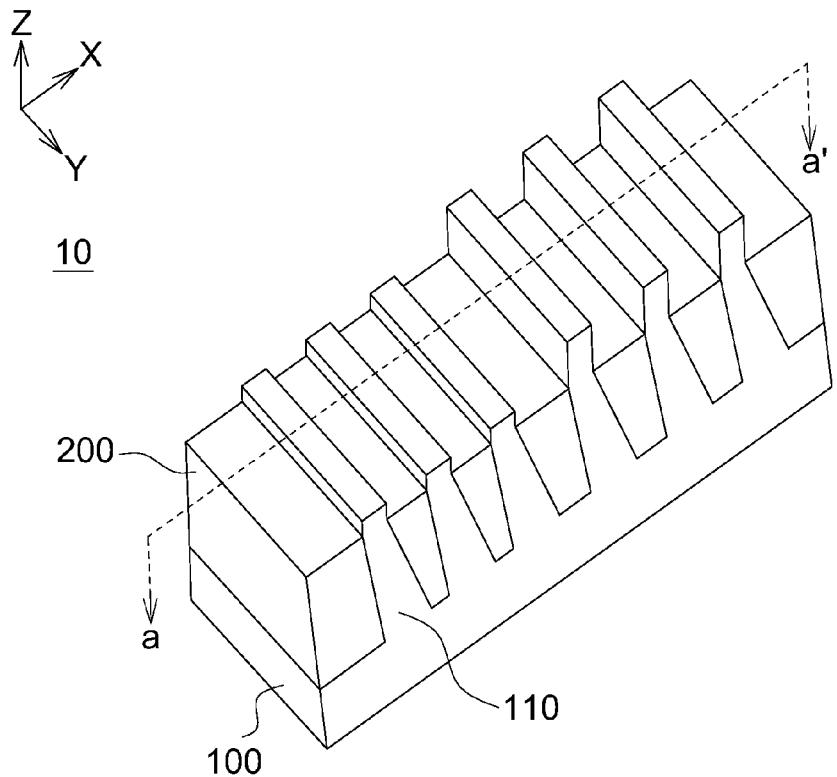
FIG. 1A shows a perspective view of a semiconductor structure according to an embodiment.

In the embodiment of the present disclosure, a semiconductor structure having at least two different fin heights is provide. The semiconductor structure may be an intermediate stage in the manufacture of a FINFET device, and the threshold voltage ($V_T$) of each FINFET can be modulated by adjusting the fin height of the semiconductor structure. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1B:
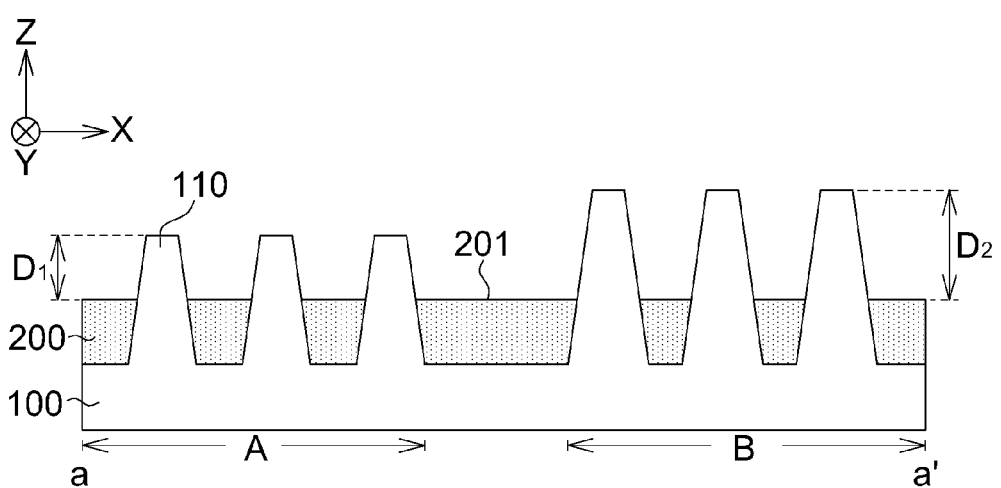
FIG. 1B shows a cross-section view of a semiconductor structure along the line a-a' in FIG. 1A.

FIG. 1A illustrates a semiconductor structure 10 according to an embodiment of present disclosure. Semiconductor structure 10 is an intermediate stage in manufacture of a FINFET device. Semiconductor structure 10 includes a substrate 100, a plurality of fins 110 and an oxide layer 200. Each fin 110 can be considered as a FINFET. FIG. 1B illustrates a cross-section view of FIG. 1A along the line a-a'. The fins 110 are protruding from the substrate 100, and are separated from each other by the oxide layer 200. Fin height means the distance between the top of the fins 110 and the oxide layer 200. The fins 110 in left part of substrate (section A) have fin height $D_1$, and the fins in right part of the substrate (section B) have fin height $D_2$. Fin height $D_1$ and $D_2$ are different. The oxide layer has a surface 201. By adjusting the fin height of semiconductor structure 10, the overall threshold voltage of the FINFET device, or the individual $V_T$ of single FINFET, can be modulated.

FIGS. 2A-2G illustrate a manufacturing method of semiconductor structure 10 according an embodiment. As shown FIG. 2A, a substrate 100 is provide. A hard mask 300 is formed on and covers the entire substrate 100. The hard mask 300 may be silicon nitride, silicon oxynitride, or the like. A patterned photoresist layer 400 is disposed on the hard mask 300. The patterned photoresist layer 400 is used for patterning substrate 100 and hard mask 300.

Figure 2A:
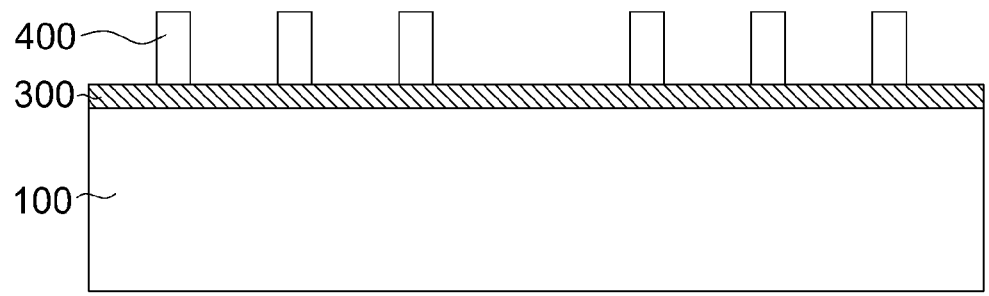
FIGS. 2A-2G show a manufacturing method of a semiconductor structure according to an embodiment.
Figure 2B:
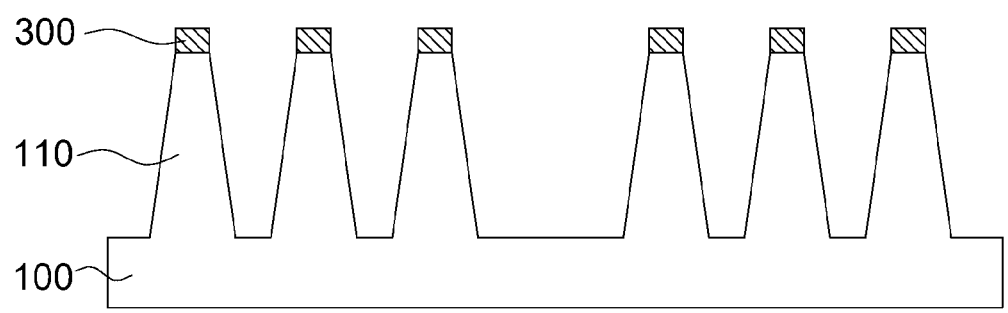

As shown in FIG. 2B, the pattern of the patterned photoresist layer 400 is transferred into the hard mask 300 and the substrate 100 via etching process. As a result, a plurality of fins 110 is protruding from the substrate 100, and the hard mask 300 is capping on the fins 110. The fins 100 are ladder-shaped in this embodiment, but not limited there to. The shape of fins 100 may be various according to the different etching parameters, such as time and etchants.

Figure 2C:
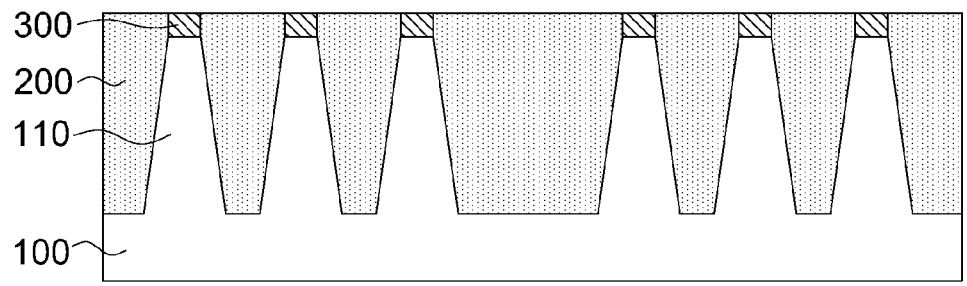

As shown in FIG. 2C, depositing an oxide material on the substrate 100, covering the fins 110 and the hard mask 300, and then remove the oxide material above the hard mask 300 to form an oxide layer 200. The oxide material is used for isolating the adjacent fins, which is called shallow trench isolation technique (STI). The extra oxide material can be removed by chemical mechanic polishing (CMP) process. Since the CMP process will automatically stop at hard mask 300, the top of the hard mask 300 is even with the top surface of oxide layer 200. After forming the oxide layer 200, the fins 110 are separated each other by the oxide layer 200.

Figure 2D:
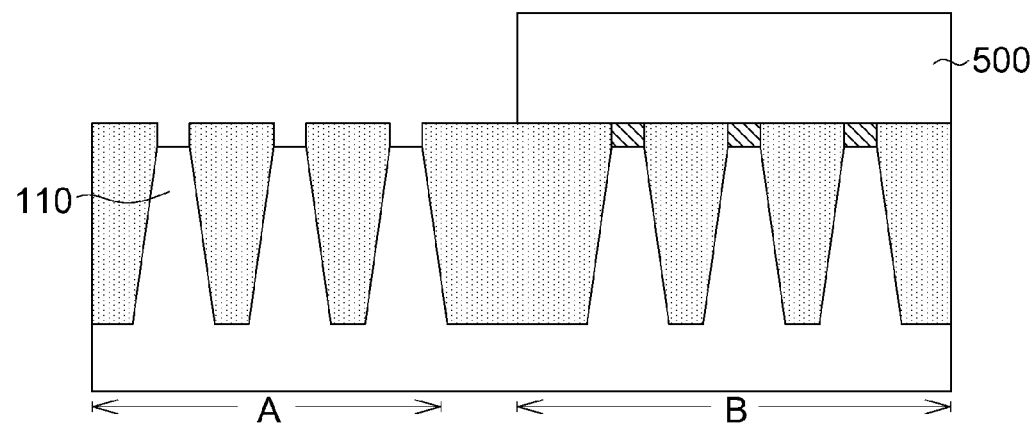

As shown in FIG. 2D, the substrate 100 is divided into two regions, region A and region B. The fins 110 in region B are covered by a photoresist layer 500, and then the hard mask 300 covering the fins 110 in region A are remove. The etchant used for removing hard mask 300 in region A must have high selectivity, so that leaving the nearby oxide layer 200 and the underlying fins 110 unharmed. In this embodiment, each region includes 3 fins, but is not limited thereto. The number of the fins may various to correspond the different FINFET devices.

Figure 2E:
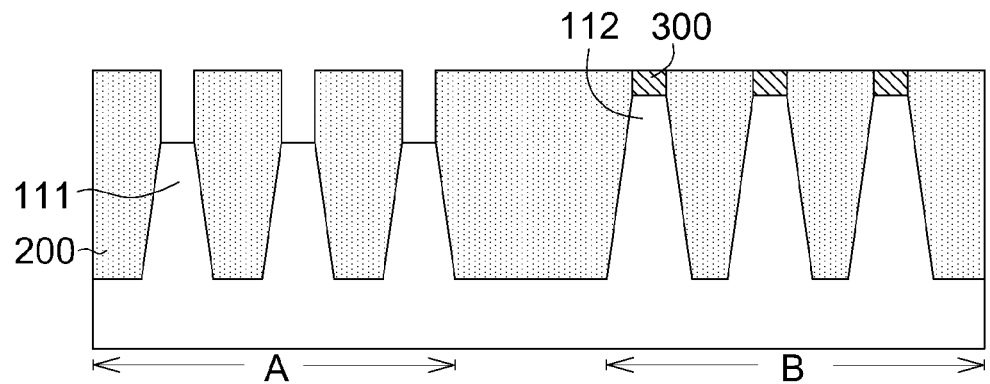

As shown in FIG. 2E, etching back the fins 110 in region A. Since fins 110 are made of semiconductor material including silicon, this process is generally called "silicon recess". After silicon recess process, the fins in region A are shorter than fins in region B. The shorter fins are denoted to first fin 111 and the taller fins are denoted to second fin 112 for convenience. In this embodiment, the first fins 111 are disposed in the left part of the substrate (region A), and the second fins 112 are disposed in the right part of the substrate (region B), but not limited thereto. The arrangement of the first fins and the second fins can be adjusted in the step of forming the photoresist layer 500 (FIG. 2D). In one embodiment, the first fins 111 and the second fins can be randomly arranged. For example, the first fins and the second fins can be alternately arranged. The enchant used for silicon recess step must have high selectivity and so that leaving the nearby oxide layer 200 unharmed.

Figure 2F:
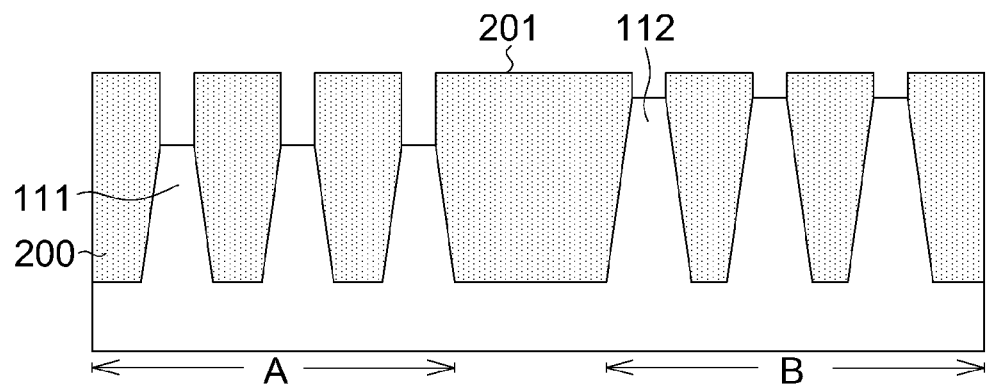

As shown in FIG. 2F, removing the hard mask 300 over the second fins 112. Similarly to step in FIG. 2D, the etchant used for removing hard mask 300 must have high selectivity so that leaving the nearby oxide layer 200 and the underlying second fins 112 unharmed.

Figure 2G:
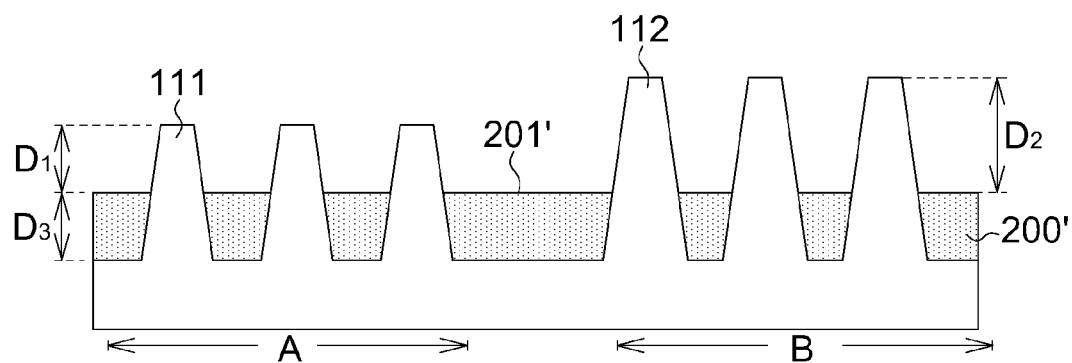

As shown in FIG. 2G, etching the oxide layer 200 to expose the first fin 111 and the second fin 112, forming a STI oxide layer 200', and then accomplish the semiconductor structure 10. Since the previous etching step do not damage the oxide layer 200, the surface 201 of oxide layer 200 (FIG. 2E) should be even. Thus, by controlling the etching parameter of oxide, such as etching time, it is easy to form a uniform and even surface 201' of STI oxide 200'. In one embodiment, the STI oxide layer 200' has a uniform thickness $D_3$ between 400 Å (angstrom) and 600 Å.

Besides, the first fins 111 and the second fins 112 have different fin heights D1 and D2, respectively. The fin height means the exposed portion of the fin, which is the distance between the top of fin and the oxide layer. In one embodiment, the semiconductor structure includes two different fin height, wherein the first fin is larger than 50 Å and the second fin is 50-500 Å, but the disclosure is not limited thereto. In other embodiment, the structure can have 3 or more different fin heights.

Figure 3:
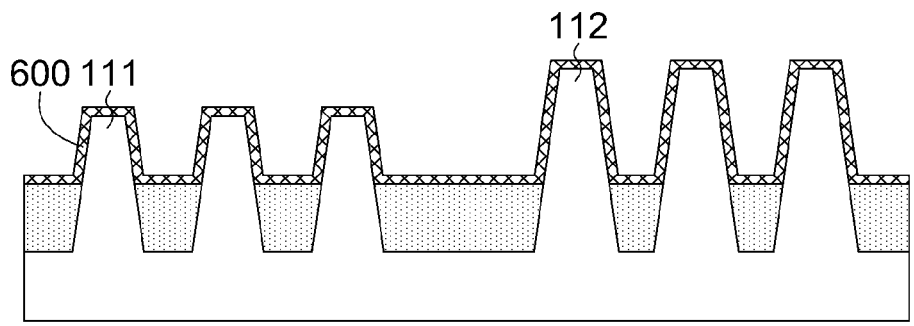
FIG. 3 shows a semiconductor structure according to another embodiment.

As described above, the semiconductor structure 10 is the intermediate stage in the manufacture of a FINFET device. That is, as shown in FIG. 3, a continuous gate structure 600 can be form over the first fins 111 and second fins 112, and the fins can be doped implants to define source and drain to define a plurality of FINFETs. The gate structure 600 can include a gate dielectric layer (not shown) and a gate electrode layer (not show) over the gate dielectric layer. The fins with different fin heights have different channel width, thereby effect the $V_T$ value of FINFET. Moreover, the fins are usually doped with angled implants. Thus, the fins with different fin heights may have different doping concentration as a result of different incident angles. The different doping concentration also effect the $V_T$ value of FINFET device. In conclusion, the $V_T$ value of each FINFET or overall FINFET device can be modulated by adjusting the fin height of semiconductor structure 10.

Beside, the above embodiment use Si recess process to adjust fin height so as to keep a uniform and even surface of STI oxide layer (201' in FIG. 2G). The even STI oxide surface is good for the consequent FINFET process. Considering semiconductor structure in FIG. 3 for example, the thickness of STI oxide layer 200' and gate structure 600 are uniform. If user want to separated individual FINFET, the gate structure 600 can be etched to fixed depth without remaining loading on the STI oxide surface 201'. That is, it is easy to form identical poly profile in each FINFET on even STI oxide surface.

While the disclosure has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, comprising:
    forming a plurality of fins on a substrate, wherein a hard mask is disposed on top of the fins, and the fins at least include a first fin and a second fin;
    forming an oxide material covers the substrate, the fins and the hard mask;
    removing the oxide material above the hard mask;
    forming a photoresist layer to cover the second fin;
    removing the hard mask on the first fin and then etching the first fin;
    removing the photoresist layer and the hard mask on the second fin; and
    etching the oxide material to form an oxide layer, wherein the surface of the oxide layer is uniform and even plane, and the distance between the oxide layer and top of the first fin is smaller the distance between the oxide layer and top of the second fin;
    wherein the step of etching the oxide layer is performed after the step of etching the first fin.

2. The manufacturing method according to claim 1, further comprising:
    forming a gate dielectric layer on the fins; and
    forming a gate electrode layer on the gate dielectric layer.

3. The manufacturing method according to claim 2, wherein the semiconductor structure is a FINFET device.

4. The manufacturing method according to claim 1, wherein the oxide layer has a uniform thickness between 400 Å and 600 Å.

5. The manufacturing method according to claim 1, wherein the first fin and the second fin have different $V_T$ value.

6. The manufacturing method according to claim 1, wherein the first fin and the second fin are doped to provide differently doped channel regions to modulate $V_T$ value.

7. The manufacturing method according to claim 1, further comprising:
    doping the fins with angled implants so as the first fin and the second fin have different doping concentration.

8. The manufacturing method according to claim 1, wherein the distance between the oxide layer and top of the first fin is larger than 50 Å.

9. The manufacturing method according to claim 1, wherein the distance between the oxide layer and top of the second fin is from 300 Å to 500 Å.

* * * * *